(12) United States Patent
Cui et al.

(10) Patent No.: US 8,815,690 B2
(45) Date of Patent: Aug. 26, 2014

(54) TUNNELING DEVICE AND METHOD FOR FORMING THE SAME

(75) Inventors: Ning Cui, Beijing (CN); Renrong Liang, Beijing (CN); Jing Wang, Beijing (CN); Jun Xu, Beijing (CN)

(73) Assignee: Tsinghua University (CN)

( * ) Notice: Subject to any disclaimer, the term of this patent is extended or adjusted under 35 U.S.C. 154(b) by 12 days.

(21) Appl. No.: 13/147,465

(22) PCT Filed: Jun. 24, 2011

(86) PCT No.: PCT/CN2011/076342
§ 371 (c)(1),
(2), (4) Date: Aug. 2, 2011

(87) PCT Pub. No.: WO2012/116529
PCT Pub. Date: Sep. 7, 2012

(65) Prior Publication Data
US 2012/0223387 A1    Sep. 6, 2012

(30) Foreign Application Priority Data

Mar. 1, 2011   (CN) .......................... 2011 1 0049183

(51) Int. Cl.
*H01L 21/336* (2006.01)
(52) U.S. Cl.
USPC .......... 438/283; 438/157; 438/176; 257/366; 257/E29.264; 257/E21.421; 257/E21.623; 257/E21.637
(58) Field of Classification Search
USPC .......... 257/366, E29.264, E21.421, E21.623, 257/E21.637; 438/283, 176, 157
See application file for complete search history.

(56) References Cited

U.S. PATENT DOCUMENTS

| 2005/0221548 A1* | 10/2005 | Doyle et al. | 438/197 |
| 2009/0026491 A1* | 1/2009 | Booth et al. | 257/105 |
| 2010/0038713 A1* | 2/2010 | Majhi et al. | 257/344 |
| 2010/0295058 A1 | 11/2010 | Cho | |

FOREIGN PATENT DOCUMENTS

CN            1938858 A        3/2007

OTHER PUBLICATIONS

Saurabh et al., "Novel Attributes of a Dual Material Gate Nanoscale Tunnel Field-Effect Transistor", Feb. 2011, Electron Devices, IEEE, vol. 58, pp. 404-410.*
International Search Report and Written Opinion for Application No. PCT/CN2011/076342 dated Dec. 8, 2011.

* cited by examiner

*Primary Examiner* — Kimberly Rizkallah
*Assistant Examiner* — Maria Ligai
(74) *Attorney, Agent, or Firm* — Lerner, David, Littenberg, Krumholz & Mentlik, LLP

(57) ABSTRACT

The present disclosure provides a tunneling device, which comprises: a substrate; a channel region formed in the substrate, and a source region and a drain region formed on two sides of the channel region; and a gate stack formed on the channel region and a first side wall and a second side wall formed on two sides of the gate stack, wherein the gate stack comprises: a first gate dielectric layer; at least a first gate electrode and a second gate electrode formed on the first gate dielectric layer; a second gate dielectric layer formed between the first gate electrode and the first side wall; and a third gate dielectric layer formed between the second gate electrode and the second side wall.

18 Claims, 10 Drawing Sheets

TUNNELING DEVICE AND METHOD FOR FORMING THE SAME

CROSS REFERENCE TO RELATED APPLICATIONS

The present application is a national phase entry under 35 USC §371 of International Application PCT/CN2011/076342, filed Jun. 24, 2011, which claims the benefit of and priority to Chinese Patent Application No. 201110049183.2, filed Mar. 1, 2011, the entire disclosures of which are incorporated herein by reference.

FIELD

The present disclosure relates to a semiconductor device fabrication and design field, and more particularly to a tunneling field effect transistor and a method for forming the same.

BACKGROUND

In the past few decades, in order to achieve higher chip densities, faster work speeds and lower power consumption, a feature size of a conventional metal-oxide-semiconductor field effect transistor (MOSFET) has continuously been scaling down, and currently it is entering into a nanoscale regime. However, a resultant severe challenge is a short channel effect, such as a threshold voltage roll-off (Vt roll-off), a drain induced barrier lowering (DIBL) or a source and drain punch-through, which cause significant increase of the off-state leakage current and thus deteriorate device performance.

Currently, various improvements and structures have been introduced to minimize a negative influence of the short channel effects, among which a tunneling field effect transistor (TFET) is a promising candidate. Since when the MOSFET device is in a sub-threshold state, i.e., the device is operating in weak inversion, and at this situation thermionic emission is a major transport mechanism, thus a sub-threshold slope of the MOSFET device at room temperature is limited to 60 mV/dec. Compared with the conventional MOSFETs, since an active region of the TFET device is essentially a tunneling junction, the TFET has a weaker or no short channel effect; moreover, a major current transport mechanism of the TFET is a band-to-band tunneling, a drain current in a sub-threshold region increase exponentially with an applied gate-source voltage, and therefore the TFET has a lower sub-threshold slope and the drain current is almost not influenced by operating temperature.

A fabricating process of the TFET is compatible with that of a conventional complementary metal-oxide-semiconductor field effect transistor (CMOSFET). A structure of the TFET is based on a MOS-gated p-i-n diode. A typical conventional n-type TFET is shown in FIG. 1. Specifically, the n-type TFET comprises a source region 1000' with p-type doping and a drain region 2000' with n-type doping, a channel region 3000' separates the source region 1000' and the drain region 2000', and a gate stack 4000' comprises a gate dielectric layer and a gate electrode, which are disposed above the channel region 3000'.

When the TFET device is in an off-state, i.e., when no gate voltage is applied, a junction formed between the source region 1000' and the drain region 2000' is a reverse biased diode. Since a potential barrier established by the reverse biased diode is larger than that established by the CMOSFET, even when a channel length is very short, the direct tunneling current and the sub-threshold leakage current of the TFET device decrease greatly. When a voltage is applied to the gate terminal of the TFET, an electron conducting path is generated in the channel region 3000' by the field effect. Once an electron density in the channel becomes degenerated, a tunneling junction is formed between the source region 1000' and the channel region 3000'. Then the tunneling current flows through this tunneling junction. From a viewpoint of the energy band, a tunnel length of a p-n junction formed between the source region 1000' and the channel region 3000' is mainly adjusted by controlling the gate voltage for the TFET device based on a MOS-gated p-i-n diode. With a geometric dimension of the TFET shrinking down, in order to obtain a higher ratio of on-state current to off-state current ($I_{on}/I_{off}$) and a lower sub-threshold slope, typical methods used are: improving a steepness of a impurity doping concentration at an interface of the p-n junction formed between the source region and the channel region; introducing a narrow energy band gap material as the source region so that a heterostructure is formed between the source region and the channel region. For example, silicon is used for the channel while germanium (Ge) or InAs etc. is employed for the source region. However, these methods greatly increase difficulty and cost of the fabrication process. The introduction of the narrow energy band gap materials inevitably results in a sharp increase of the off-state current as well.

SUMMARY

The present disclosure is aimed to solve at least one of the above mentioned technical problems.

According to an aspect of the present disclosure, a tunneling device is provided, comprising: a substrate; a channel region formed in the substrate; a source region and a drain region formed on two sides of the channel region, wherein the drain region is of a first doping type and the source region is of a second doping type, and the first doping type and the second doping type are opposite; and a gate stack formed on the channel region and a first side wall and a second side wall formed on two sides of the gate stack, wherein the gate stack comprises: a first gate dielectric layer; at least a first gate electrode and a second gate electrode distributed in a direction from the source region to the drain region and formed on the first gate dielectric layer, and the first gate electrode and the second gate electrode have different work functions; a second gate dielectric layer formed between the first gate electrode and the first side wall; and a third gate dielectric layer formed between the second gate electrode and the second side wall, wherein the second gate dielectric layer and the third gate dielectric layer are connected with the first gate dielectric layer respectively.

In one embodiment, the channel region is of the first doping type, the second doping type or is intrinsic and the channel region connects the source region and the drain region.

In one embodiment, the tunneling device is a n-type tunneling field effect transistor, the source region has a p-type resistivity, the drain region has a n-type resistivity, the first gate electrode is located adjacent to the source region and has a first work function, and the second gate electrode is located adjacent to the drain region and has a second work function, wherein the first work function is lower than the second work function by at least 0.1 eV.

In one embodiment, the tunneling device is a p-type tunneling field effect transistor, the source region has a n-type resistivity, the drain region has a p-type resistivity, the first gate electrode is located adjacent to the source region and has a first work function, and the second gate electrode is located adjacent to the drain region and has a second work function, wherein the first work function is larger than the second work function by at least 0.1 eV In one embodiment, the first gate electrode has an L-shape and the second gate electrode partially covers the first gate electrode.

Another aspect of the present disclosure provides a method for forming a tunneling device, comprising steps of: providing a substrate; forming a sacrificial gate stack on the substrate; implanting respectively a first doping impurity and a second doping impurity into the substrate to form a source region and a drain region, and defining an area between the source region and the drain region as a channel region, wherein the drain region is of a first doping type and the source region is of a second doping type and the first doping type and the second doping type are opposite; annealing to activate the first doping impurity and the second doping impurity; forming a first side wall and a second side wall on two sides of the sacrificial gate stack respectively, forming a first interlayer dielectric layer on a side of the first side wall and forming a second interlayer dielectric layer on a side of the second side wall; removing the sacrificial gate stack to form a concave window; forming a first gate dielectric layer on a bottom of the concave window; forming a second gate dielectric layer in the concave window and on a surface of the first side wall and extending the second gate dielectric layer on a top surface of the first interlayer dielectric layer; forming a third gate dielectric layer in the concave window and on a surface of the second side wall and extending the third dielectric layer on a top surface of the second interlayer dielectric layer, wherein the second gate dielectric layer and the third gate dielectric layer are connected with the first gate dielectric layer respectively; forming conformally a first gate electrode material layer with a first work function on the first gate dielectric layer, the second gate dielectric layer and the third gate dielectric layer; etching anisotropically the first gate electrode material layer to remove the first gate electrode material layer on the third gate dielectric layer on the top surface of the second interlayer dielectric layer, to remove the first gate electrode material layer on the second gate dielectric layer on the top surface of the first interlayer dielectric layer, and to remove the first gate electrode material layer on a part of the first gate dielectric layer to form a first gate electrode in the concave window and on a side surface of the second gate dielectric layer; and depositing a second gate electrode material with a second work function within a space defined by the first gate electrode, the first gate dielectric layer and the side surface of the second side wall to form a second gate electrode, wherein the second work function is different from the first work function.

In one embodiment, the step of forming a second gate electrode comprises: depositing a second gate electrode material within the space defined by the first gate electrode, the first gate dielectric layer and the side surface of the third gate dielectric layer and extending the second gate electrode material to a surface of the first gate electrode material layer formed on a top surface of the first interlayer dielectric layer and on a top surface of the second interlayer dielectric layer; removing the second gate electrode material on the surface of the first gate electrode material layer, removing the first gate electrode material layer on the second gate dielectric layer and on the third gate dielectric layer, and removing the second gate dielectric layer and the third gate dielectric layer on the first interlayer dielectric layer and on the second interlayer dielectric layer respectively; and planarizing the second gate electrode material.

In one embodiment, the method further comprises introducing reactive ions into the first gate electrode material layer to adjust the first work function.

In one embodiment, the reactive ions are provided by ion implantation, plasma treatment or thermal annealing.

In one embodiment, the tunneling device is a n-type TFET, the source region has a p-type resistivity, the drain region has a n-type resistivity, the first gate electrode is located adjacent to the source region and has a first work function, and the second gate electrode is located adjacent to the drain region and has a second work function, wherein the first work function is lower than the second work function by at least 0.1 eV.

In one embodiment, the tunneling device is a p-type TFET, the source region has a n-type resistivity, the drain region has a p-type resistivity, the first gate electrode is located adjacent to the source region and has a first work function, and the second gate electrode is located adjacent to the drain region and has a second work function, wherein the first work function is larger than the second work function by at least 0.1 eV.

In one embodiment, the method further comprises: forming a first contact layer and a second contact layer on the source region and the drain region respectively; and forming the first interlayer dielectric layer and the second interlayer dielectric layer on the first contact layer and the second contact layer respectively.

Another aspect of the present disclosure provides a method for forming a tunneling device, comprising steps of: providing a substrate; forming a sacrificial gate stack on the substrate; implanting respectively a first doping impurity and a second doping impurity into the substrate to form a source region and a drain region, and defining an area between the source region and the drain region as a channel region, wherein the drain region is of a first doping type and the source region is of a second doping type and the first doping type and the second doping type are opposite; annealing to active the first doping impurity and the second doping impurity; forming a first side wall and a second side wall on two sides of the sacrificial gate stack respectively, forming a first interlayer dielectric layer on a side of the first side wall and forming a second interlayer dielectric layer on a side of the second side wall; removing the sacrificial gate stack to form a concave window; forming a first gate dielectric layer on a bottom of the concave window; forming a second gate dielectric layer in the concave window and on a surface of the first side wall; forming a third gate dielectric layer in the concave window and on a surface of the second side wall, wherein the second gate dielectric layer and the third gate dielectric layer are connected with the first gate dielectric layer respectively; vaporizing or sputtering at an angle a first gate electrode material layer with a first work function on a part of the first gate dielectric layer, on a top surface of the first interlayer dielectric layer, on a top surface of the second interlayer dielectric layer and on a side surface of the first side wall, wherein the side surface of the first side wall and the side surface of the second side wall are in the concave window; depositing a second gate electrode material with a second work function within a space defined by the first gate electrode material layer, the first gate dielectric layer and the side surface of the third gate dielectric layer and extending the second gate electrode material to a surface of the first gate electrode material layer formed on a top surface of the first interlayer dielectric layer and on a top surface of the second interlayer dielectric layer, wherein the second work function is different from the first work function; removing the second gate electrode material on the surface of the first gate electrode material layer, removing the first gate electrode material layer on the second gate dielectric layer and on the third gate dielectric layer, and removing the second gate dielectric layer and the third gate dielectric layer on the first interlayer dielectric layer and on the second interlayer dielectric layer respectively; and planarizing the second gate electrode material.

In one embodiment, the method further comprises introducing reactive ions in the first gate electrode material layer to adjust the first work function.

In one embodiment, the reactive ions are provided by ion implantation, plasma treatment or thermal annealing.

In one embodiment, the tunneling device is a n-type TFET, the source region has a p-type resistivity, the drain region has a n-type resistivity, the first gate electrode is located adjacent to the source region and has a first work function, and the second gate electrode is located adjacent to the drain region and has a second work function, wherein the first work function is lower than the second work function by at least 0.1 eV In one embodiment, the tunneling device is a p-type TFET, the source region has a n-type resistivity, the drain region has a p-type resistivity, the first gate electrode is located adjacent to the source region and has a first work function, and the second gate electrode is located adjacent to the drain region and has a second work function, wherein the first work function is larger than the second work function by at least 0.1 eV The embodiments of the present disclosure have the following advantages.

1. Since the TFET has a lateral hetero-material gate work function structure, the energy band profile in the channel region may be modulated, which not only significantly reduces a sub-threshold slope of the transistor by using an energy band engineering technique, but also greatly increases a drive current.

2. The first gate electrode or the second gate electrode may be of various metals or alloys, doped polycrystalline silicon or doped polycrystalline silicon germanium; hence the lateral hetero-material gate work function can be precisely adjusted by controlling parameters such as the ratio of metal alloys, type and concentration of doped impurities and germanium mole fraction. The fabrication techniques of the gate electrodes described above have a wide process window, and are easy to be implemented.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION OF EMBODIMENTS OF THE DISCLOSURE

Figure 1:
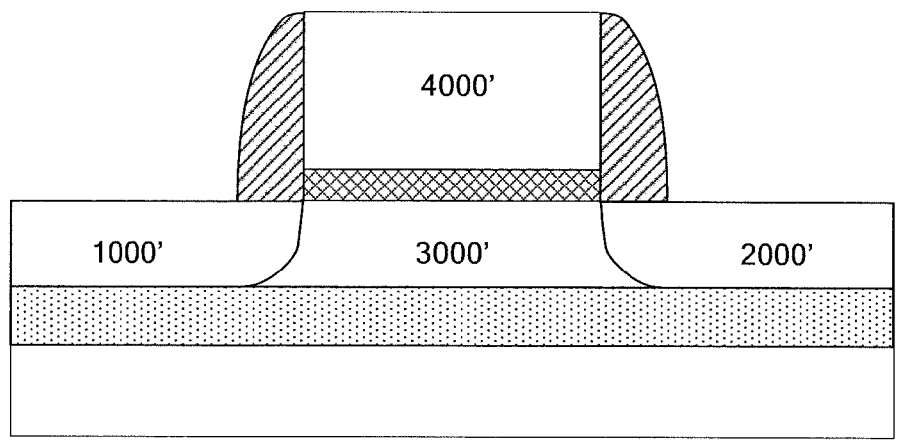
FIG. 1 is a typical conventional n-type TFET.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

With a geometric dimension of the TFET shrinking down, in order to obtain a higher ratio of on-state current to off-state current ($I_{on}/I_{off}$) and a lower sub-threshold slope, a lateral distribution of a gate work function along the source region to drain region direction is constant for a conventional TFET device, which is not favorable for further optimization of device performance. Therefore, according to an embodiment of the present disclosure, a first gate electrode and a second gate electrode with different work functions respectively are adopted, so that an energy band profile in the channel region may be modulated, which not only significantly reduces a sub-threshold slope of the transistor by using an energy band engineering technique, but also greatly increases a drive current.

Figure 2:
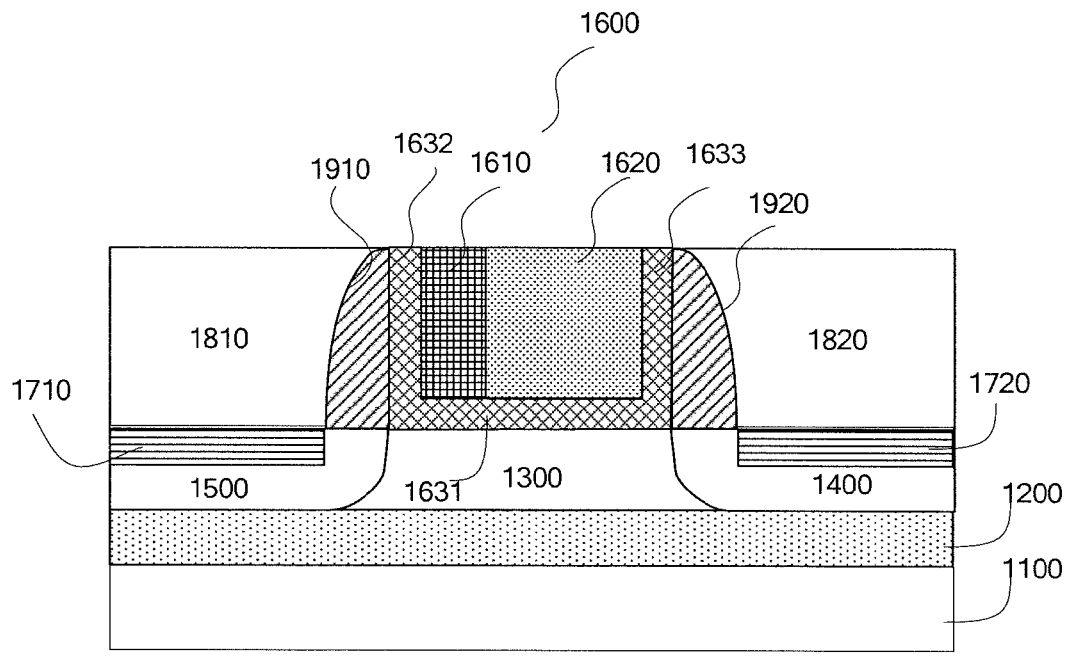
FIG. 2 is a cross-sectional view of a TFET based on a hetero-material gate work function according to an embodiment of the present disclosure.

FIG. 2 is a cross-sectional view of a TFET based on a hetero-material gate work function according to an embodiment of the present disclosure. The TFET comprises a substrate 1100. In one embodiment, a buffer layer 1200 may be formed on the substrate 1100. The substrate 1100 may be a single-crystal silicon wafer or silicon on insulator (SOI) wafer substrate, which may further reduce a substrate leakage current of the transistor. Or, the substrate 1100 may be of other types, such as a single-crystal germanium substrate, a single-crystal silicon germanium substrate, a polycrystalline silicon substrate, a polycrystalline silicon germanium substrate, a carbon nanotube substrate, a graphene substrate, a GaAs substrate, an InAs substrate, an InSb substrate, a GaSb substrate. In the embodiment, the substrate 1100 may be doped to have an n-type resistivity for fabricating a n-type TFET; while the substrate 1100 may be doped to have a p-type resistivity for fabricating a p-type TFET. In the embodiment, when fabricating the n-type TFET, phosphorus atoms or arsenic atoms may be doped into the single-crystal silicon substrate to have a doping concentration within $10^{13}$-$10^{18}$ cm$^{-3}$; when fabricating the p-type TFET, boron atoms may be doped into the single-crystal silicon substrate to have a doping concentration within $10^{13}$-$10^{18}$ cm$^{-3}$. In fact, the TFET does not have a specific restriction on doping type of the substrate as the conventional MOSFET does, since the MOSFET relies on an inversion of a channel charge due to the field effect, while the TFET is based on band-to-band tunneling of MOS-gated inverse biased p-i-n junction. For the p-i-n junction, the "i" layer may be a lightly doping layer or an intrinsic layer.

As shown in FIG. 2, the TFET may further comprise a channel region 1300, a source region 1500 and a drain region 1400. The source region 1500 and the drain region 1400 are formed on two sides of the channel region 1300 respectively. The drain region 1400 is of a first type doping and the source region 1500 is of a second type doping, and the doping types are opposite. For example, in one embodiment, the drain region 1400 is of the n-type doping, the source region is of the p-type doping and the channel region 1300 is of the n-type doping, the p-type doping or intrinsic. However, the doping concentration of the channel region 1300 is lower than that of the drain region 1400 or the source region 1500. The TFET further comprises a gate stack 1600 formed on the channel region 1300, and a first side wall 1910 and a second side wall 1920 formed on two sides of the gate stack 1600 respectively. The gate stack may comprise a first gate dielectric layer 1631, and may at least comprise a first gate electrode 1610 and a second gate electrode 1620 formed on the first gate dielectric layer 1631, whereas the first gate electrode 1610 and the second gate electrode 1620 are distributed from the source region 1500 to the drain region 1400. The first gate electrode 1610 and the second gate electrode 1620 have different work functions. In one embodiment, the first type doping may be the n-type doping and the second type doping may be the p-type doping, which means the TFET is the n-type TFET. In another embodiment, the first type doping may be the p-type doping and the second type doping may be the n-type doping, which means the TFET is the p-type TFET.

In one embodiment, the first gate electrode 1610 is located at a side near the source region 1500 and has a first work function; the second gate electrode 1620 is located at a side near the drain region 1400 and has a second work function. The first work function is smaller than the second work function. In another embodiment, the first work function is larger than the second work function.

In one embodiment, the TFET may further comprise: a second gate dielectric layer 1632 formed between the first gate electrode 1610 and the first side wall 1910; and a third gate dielectric layer 1633 formed between the second gate electrode 1620 and the second side wall 1920. The second gate dielectric layer 1632 and the third gate dielectric layer 1633 are connected with the first gate dielectric layer 1631 respectively.

Figure 3:
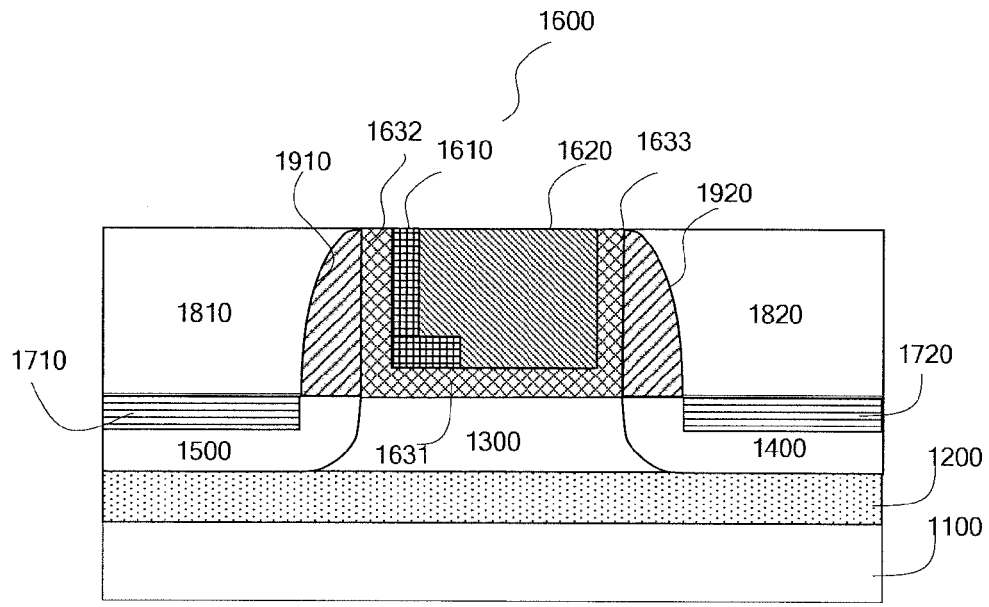
FIG. 3 is a cross-sectional view of a TFET having a hetero-material gate work function according to another embodiment of the present disclosure.

FIG. 3 is a cross-sectional view of a TFET having a heteromaterial gate work function according to another embodiment of the present disclosure. The first gate electrode 1610 has an L-shape and the second gate electrode 1620 partially covers the first gate 1610 electrode.

In the embodiment, the TFET further comprises a first contact layer 1710 and a second contact layer 1720 formed on the source region 1500 and the drain region 1400 respectively, and a first interlayer dielectric (ILD) layer 1810 and a second interlayer dielectric (ILD) layer 1820 formed on the first contact layer 1710 and the second contact layer 1720 respectively.

FIGS. 4-14 are cross-sectional views of a TFET showing a process of a method for forming a TFET having a heteromaterial gate work function according to a first embodiment of the present disclosure. The method comprises the following steps.

Figure 4:
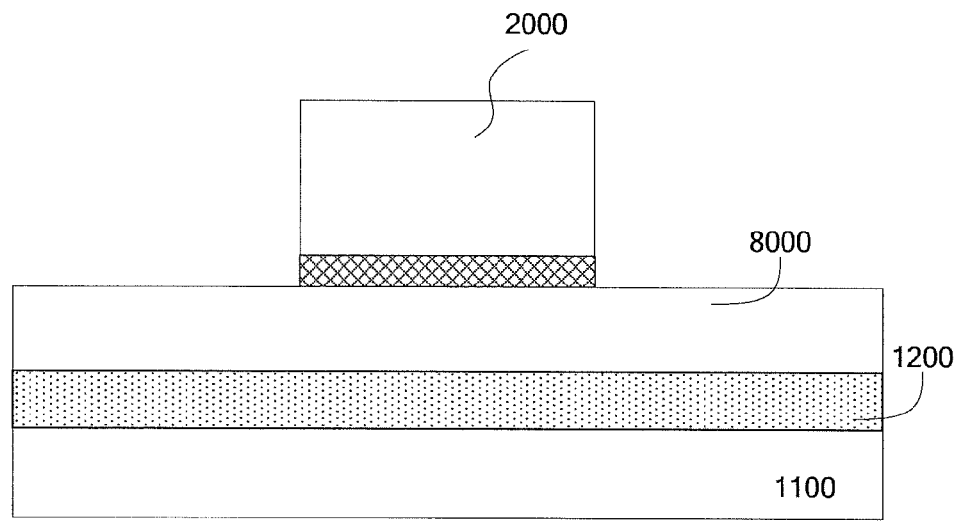
FIGS. 4-14 are cross-sectional views of a TFET showing a process of a method for forming a TFET having a hetero-material gate work function according to a first embodiment of the present disclosure.

Step S101, a substrate 1100 is provided. In the embodiment, the substrate 1100 may be a single-crystal silicon wafer or silicon on insulator (SOI) wafer, which may further reduce a substrate leakage current of the transistor. Or, the substrate 1100 may be of other types, such as a single-crystal germanium substrate, a single-crystal silicon germanium substrate, a polycrystalline silicon substrate, a polycrystalline silicon germanium substrate, a carbon nanotube substrate, a graphene substrate, a GaAs substrate, an InAs substrate, an InSb substrate, a GaSb substrate. In the embodiment, the substrate 1100 may be doped to have an n-type resistivity before fabricating a n-type TFET; the substrate 1100 may be doped to have a p-type resistivity before fabricating a p-type TFET. In the embodiment, when fabricating the n-type TFET, phosphorus atoms or arsenic atoms may be doped into the single-crystal silicon substrate to have a doping concentration within $10^{13}$-$10^{18}$ cm$^{-3}$; when fabricating the p-type TFET, boron atoms may be doped into the single-crystal silicon substrate to have a doping concentration within $10^{13}$-$10^{18}$ cm$^{-3}$. In fact, the TFET does not have a specific restriction on doping type of the substrate as the conventional MOSFET does, since the MOSFET relies on the inversion of channel charge while a dominant principle of the TFET is band-to-band tunneling of MOS-gated inverse biased p-i-n junction. For the p-i-n junction, the "i" layer may be a lightly doping layer or an intrinsic layer. In one embodiment, as shown in FIG. 4, an insulating layer 1200 is formed on the silicon substrate 1100, and a semiconductor layer 8000 is formed on the insulating layer 1200. The semiconductor layer 8000 may be of materials such as Si, SiGe or Ge. Similarly, in one embodiment, the substrate 1100 may be a SOI or a GOI (Germanium on Insulator) substrate comprising the above layers.

Step S102, a sacrificial gate stack 2000 is formed on the semiconductor layer 8000, as shown in FIG. 4. Specifically, a sacrificial gate dielectric layer is formed on the semiconductor layer 8000 and then a sacrificial gate electrode layer is formed on the sacrificial gate dielectric layer. In one embodiment, the sacrificial gate dielectric layer may be a $SiO_2$ layer or a $Si_3N_4$ layer and may grow on the semiconductor layer 8000 by thermal oxidation, deposition or any other known techniques. In one embodiment, the sacrificial gate electrode layer may be of materials such as polycrystalline silicon or polycrystalline silicon germanium. A thickness of the sacrificial gate electrode layer mainly depends on a designed thickness of a final device. Since a gate-last process is adopted in the embodiment, the sacrificial gate electrode layer will be removed during a subsequent fabrication process. Further, the sacrificial gate electrode layer may be used as a mask layer when impurity ions are implanted into the source region and drain region for self-aligned heavily doping. In the embodiment, the sacrificial gate electrode layer has a thickness within a range from 30 nm to 400 nm and preferably of 150 nm. In the embodiment, the substrate 1100 of the n-type doping is taken as an example. The sacrificial gate electrode layer is patterned into the sacrificial gate electrode. Specifically, the sacrificial gate electrode layer may be patterned into the sacrificial gate electrode with a designed length and width. In addition, when removing or etching the sacrificial gate electrode layer, a technical solution with a high selectivity ratio between the sacrificial gate electrode layer and the sacrificial gate dielectric layer is adopted preferably, according to which the sacrificial gate dielectric layer below is not etched at all or is not etched completely.

Step S103, a first doping impurity and a second doping impurity are implanted into the semiconductor layer 8000 to respectively form a channel region 1300, and the source region 1500 and the drain region 1400 displaced on the two sides of the channel region 1300. The drain region 1400 is of a first doping type and the source region 1500 is of a second doping type. After the sacrificial gate stack 2000 is formed, the source region 1500 and the drain region 1400 of the TFET may be formed. In the embodiment, the TFET device and the conventional MOSFET have significant differences when forming the source region 1500 and the drain region 1400. For the MOSFET, when forming the n-type device, both the source region 1500 and the drain region 1400 has the n-type resistivity; when forming the p-type device, both the source region 1500 and the drain region 1400 has the p-type resistivity. However, for the TFET, when forming the n-type device, the source region 1500 has the p-type resistivity while the drain region 1400 has the n-type resistivity, and when the TFET works, the source region 1500 is grounded and a positive voltage is applied to the gate and the drain region 1400; when forming the p-type device, the source region 1500 has the n-type resistivity while the drain region 1400 has the p-type resistivity, and when the TFET works, the source region 1500 is grounded and a negative voltage is applied to the gate and the drain region 1400.

Figure 5:
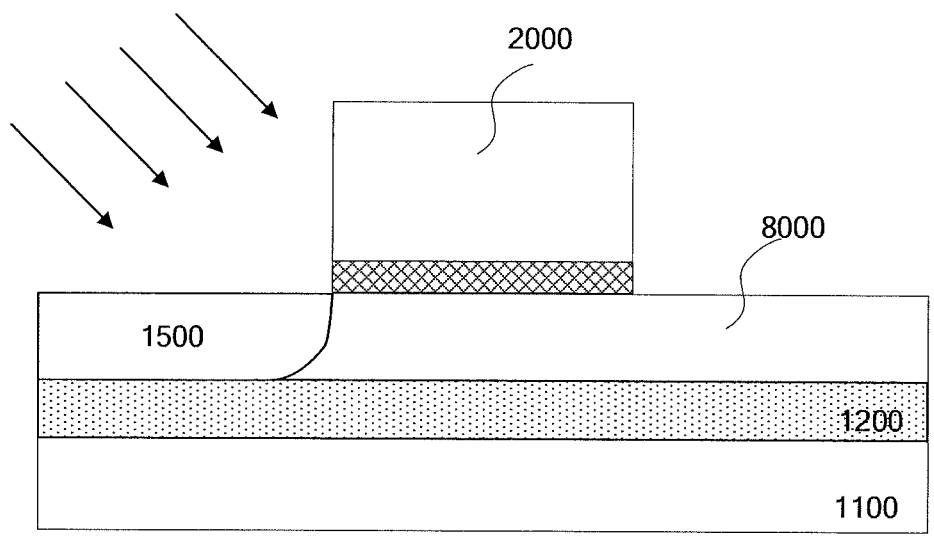
Figure 6:
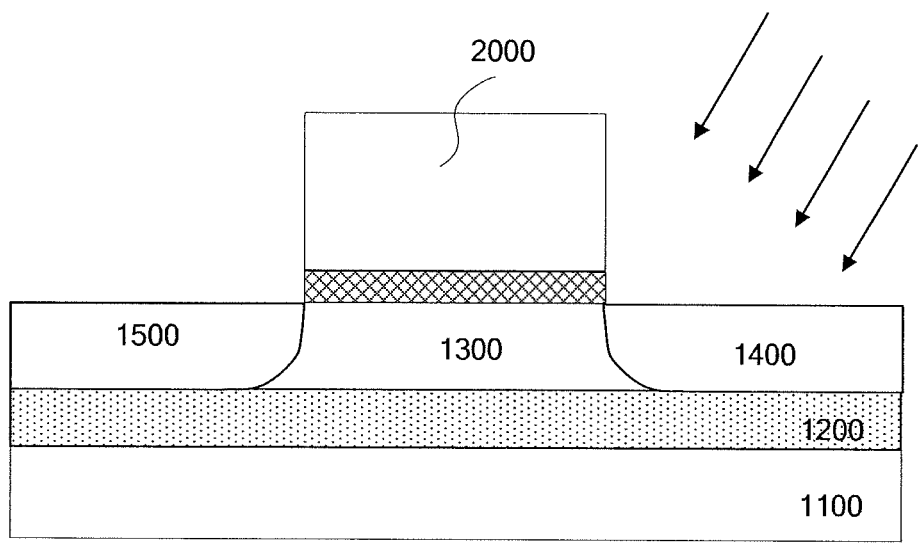

Therefore, in the embodiment, in order to form asymmetric doping types, the impurity ions need to be implanted at a certain angle twice. As shown in FIG. 5, the impurity ions are implanted into the semiconductor layer 8000 at a first angle for the first time in a direction indicated by the arrow in the figure; the doping type is p and the p-type heavily doped region (source region 1500) is formed and the doping concentration may be within a range of $10^{18}$-$10^{21}$ cm$^{-3}$. As shown in FIG. 6, the ions are implanted into the semiconductor layer 8000 at a second angle for the second time in a direction indicated by the arrow in the figure; the doping type is n and the n-type heavily doped region (drain region 1400) is formed and the doping concentration may be within a range of $10^{18}$-$10^{21}$ cm$^{-3}$. In the embodiment, the first angle and the second angle may be the same or may be different, which depends on a lateral distribution of the impurity concentration when designing the TFET device. After the ions are implanted, the doped impurity atoms are activated. Specifically, known activation annealing technologies may be used, such as rapid thermal processing, spike annealing and laser annealing, so that the doped impurity atoms can be activated and a doped source region and a drain region are formed. It should be noted that for the TFET, the steeper the impurity concentration distribution of the p-n junction formed between the source region and the channel region and between the channel region and the drain region is, the better the performance of the TFET will be. Therefore, more severe requirements are put forward on a rmal budget of the impurity activation technology and a subsequent process, so as to reduce as much as possible a re-diffusion of the doped impurity atoms in the source region and the drain region.

Figure 7:
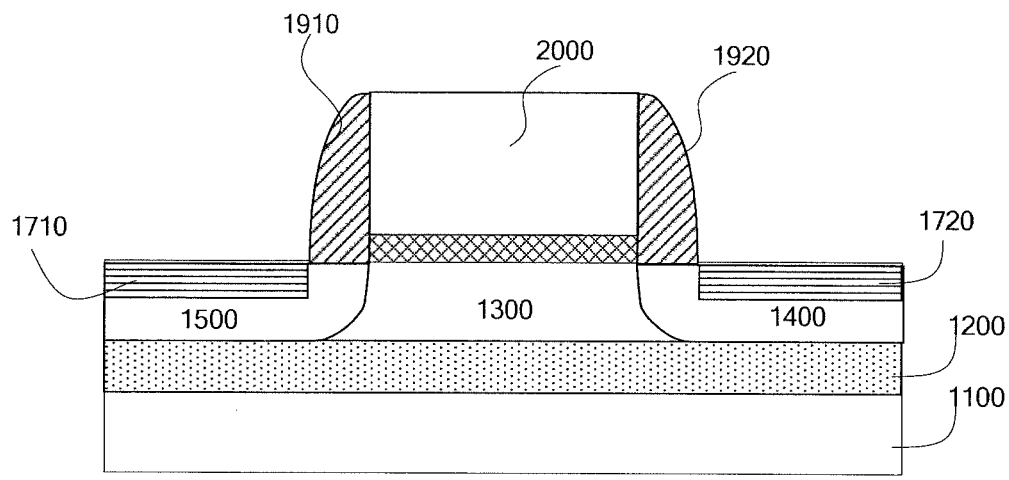

Step S104, the first side wall 1910 and the second side wall 1920 are formed on the two sides of the sacrificial gate stack 2000 respectively, as shown in FIG. 7. Then, a self-aligned metallization process is adopted to form a first contact layer 1710 in the source region 1500 and the second contact layer 1720 in the drain region 1400. The side walls may be of insulation dielectric materials such as $Si_3N_4$, $SiO_2$ or SiON. A method for forming the side walls may comprise steps of: depositing dielectric materials conformally on a top surface and two sides of the sacrificial gate electrode layer and on the two sides of the gate dielectric layer; etching back anisotropically by using plasma etching and/or wet etching, so that the dielectric materials on the sides of the sacrificial gate electrode layer are remained while other parts are removed, which means side walls of the sacrificial gate stack are formed. A height of the side walls in a vertical direction substantially equals to that of the sacrificial gate electrode layer, and the width of the side walls in a lateral direction substantially equals to a thickness of the deposited dielectric material. After the first side wall 1910 and the second side wall 1920 and the first contact layer 1710 and the second contact layer 1720 are formed, a shallow trench isolation may be formed by lithography together with recess etching techniques so as to achieve an isolation space between transistors.

Figure 8:
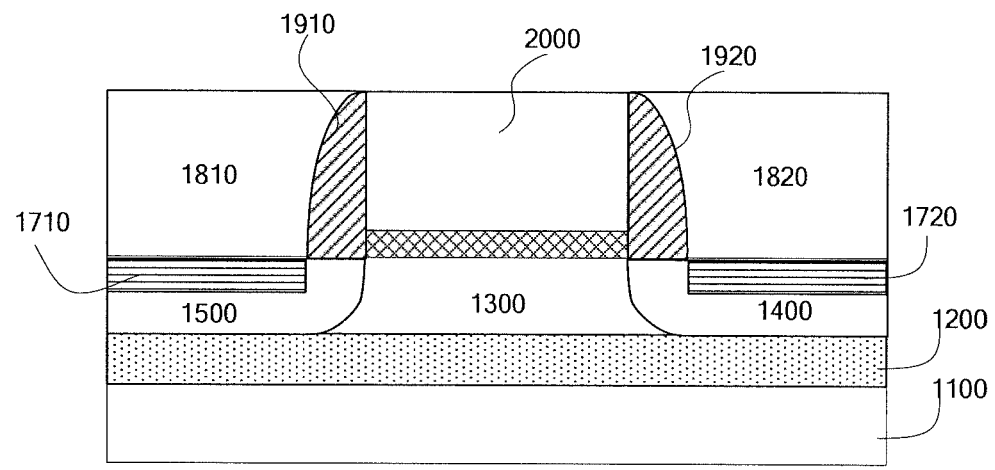

Step S105, an interlayer dielectric layer 1810 is conformally deposited on a side of the first side wall 1910; an interlayer dielectric layer 1820 is conformally deposited on a side of the second side wall 1920. During the deposition, an interlayer dielectric layer may also be deposited on the first contact layer 1710 and the second contact layer 1720 and extended to a surface of the sacrificial gate stack 2000. The interlayer dielectric layers are planarized by known techniques such as chemical mechanical polishing (CMP) or plasma etching, as shown in FIG. 8. In the embodiment, the interlayer dielectric layer may be of materials such as $Si_3N_4$, $SiO_2$ or SiON, and preferably from $SiO_2$. During deposition, the interlayer dielectric layer has a thickness larger than the height of the sacrificial gate electrode layer; so that during planarization, a top surface of the interlayer dielectric layer and the top surface of the sacrificial gate electrode layer may be at a same level for the convenience of subsequent processing.

Figure 9:
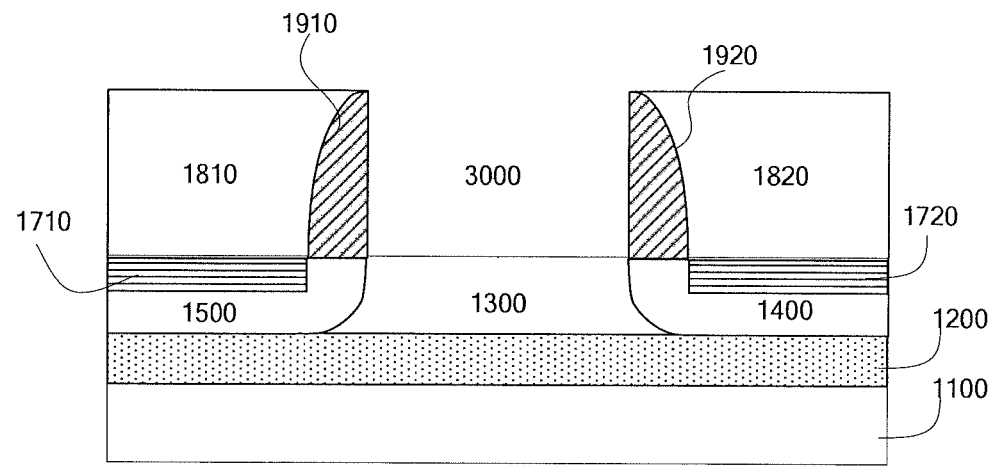

Step S106, the sacrificial gate stack 2000 is removed to form a concave window 3000, as shown in FIG. 9. In the embodiment, the sacrificial gate stack 2000 is totally removed. In another embodiment, the gate dielectric layer of the sacrificial gate stack 2000 may be remained and only the sacrificial gate electrode of the sacrificial gate stack 2000 is removed. In the embodiment, the concave window may be formed by lithography together with etching, or by an etching solution. For example, if the sacrificial gate electrode is of polycrystalline silicon or polycrystalline silicon germanium, the interlayer dielectric layer is of $SiO_2$ and the side walls are of $Si_3N_4$, wet etching solutions such as TMAH or $NH_4OH$ may be used.

In other embodiments, the sacrificial gate dielectric layer does not need to be removed but have already been fabricated at the beginning of or during the process of fabricating the transistor. Thus, the sacrificial gate dielectric layer is used as the final gate dielectric layer of the transistor. Furthermore, in this situation, the sacrificial gate dielectric layer may be formed by a high temperature processing so as to avoid the diffusion of the doping impurity atoms in the source region and drain region when the high temperature processing is needed to form the gate dielectric layer. In this case, the sacrificial gate dielectric layer will be remained in the concave window and a new gate electrode layer will be formed on the sacrificial gate dielectric layer in a subsequent process. In another embodiment, the sacrificial gate dielectric layer may be removed by a wet etching solution. It should be noted that when etching the sacrificial gate dielectric layer, an etching solution of a high selectivity ratio (for example, at lease 30:1)

should be selected to avoid a damage and corrosion to the interlayer dielectric layer and side walls by the wet etching solution.

Figure 10:
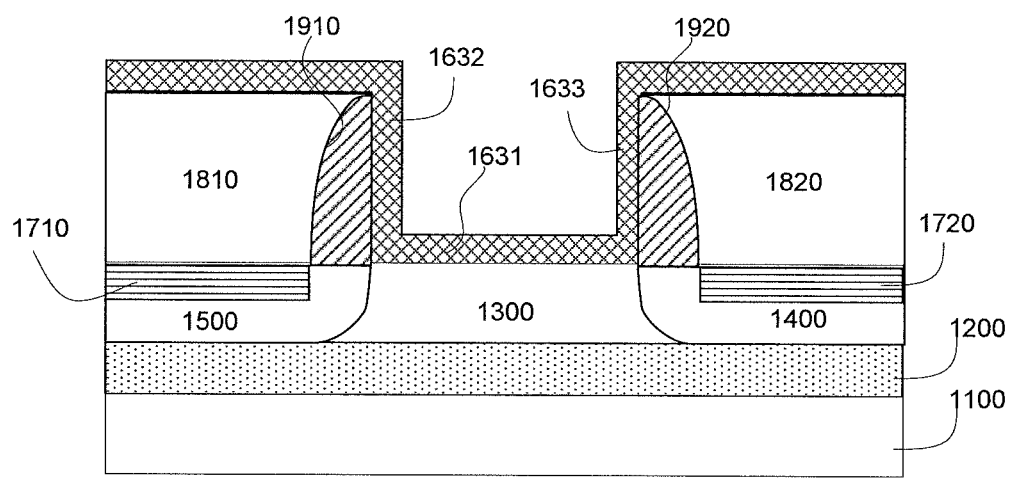

Step S107, the gate dielectric layer is formed, as shown in FIG. 10. In the embodiment, the gate dielectric layer comprises the first gate dielectric layer 1631, the second gate dielectric layer 1632 and the third gate dielectric layer 1633. In one embodiment, the gate dielectric layer may be a high-k dielectric layer of the metal oxide, such as $HfO_2$, $TiO_2$, HfSiON, or may be a ferroelectric dielectric layer, such as $BiFeO_3$, $SrTiO_3$, or may be a combination thereof. Known technologies may be adopted to form the gate dielectric layer, such as atomic layer deposition, chemical vapor deposition and coating. When these technologies are adopted, the gate dielectric layer is formed on a bottom and side walls of the concave window and on top surfaces of the interlayer dielectric layers 1810 and 1820. In another embodiment, a dry oxidization or Cyclotron Resonance Plasma enhanced oxidization may be used to form the gate dielectric layer only on the bottom of the concave window. The gate dielectric layer may be a $SiO_2$ layer or a SiON layer.

Figure 11:
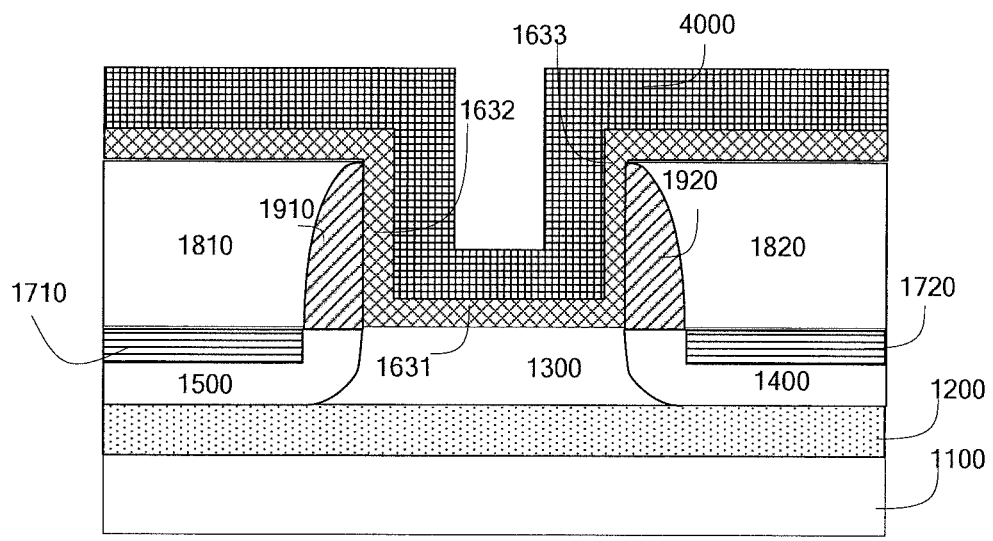

Step S108, a first gate conductive film 4000 with a first work function is deposited on the first gate dielectric layer 1631, the second gate dielectric layer 1632 and the third gate dielectric layer 1633, as shown in FIG. 11. The first gate conductive film 4000 with a first work function may be of polycrystalline silicon, polycrystalline silicon germanium or metal. In the embodiment, the first gate conductive film is formed by a conformal deposition, such as atom layer deposition (ALD), plasma enhanced chemical vapor deposition (PECVD), so that the first gate conductive film 4000 has a substantially same thickness on the first gate dielectric layer 1631, the top surfaces of the interlayer dielectric layers 1810 and 1820, the first side wall 1910 and the second side wall 1920 of the concave window 3000.

Figure 12:
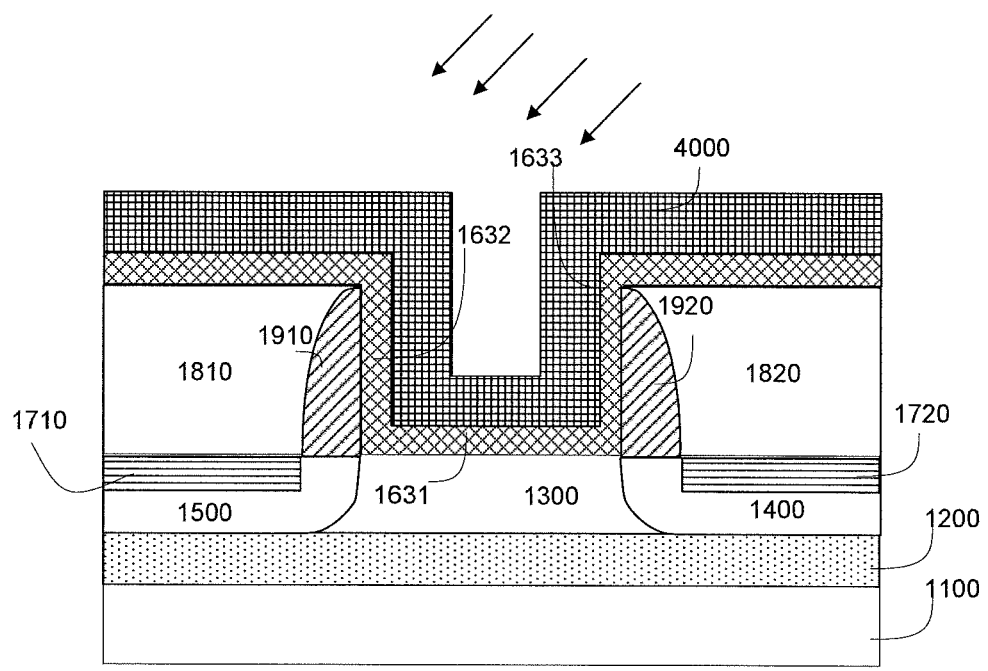

Step S109, in the embodiment, the work function of the first gate conductive film 4000 may be changed by introducing in reactive icons, as shown in FIG. 12. For example, the reactive ions may be provided by plasma process, ion implantation, remote plasma process and chemical process etc. In another embodiment, the reactive ions react with the first gate conductive film to increase or reduce the work function of the first gate conductive film; when the first gate conductive film is of metal, reactive ions such as but not limited to Er, Y, Pt, N, O, Cl, F and other elements may be adopted to change the work function of the first gate conductive film; when the first gate conductive film is of the polycrystalline silicon or the polycrystalline silicon germanium, the n-type or p-type impurity ions such as but not limited to B, Ph, As and other elements may be used as the reactive ions to change the work function of the first gate conductive film.

Figure 13:
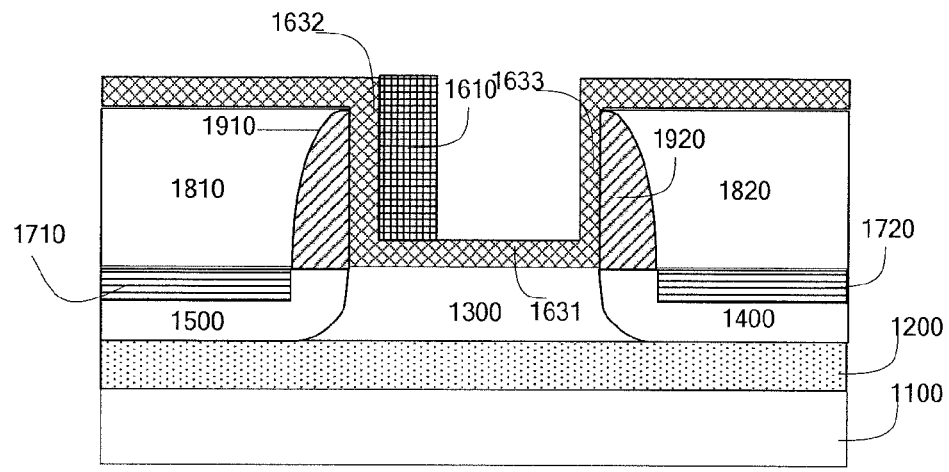

Step S110, the first gate conductive film 4000 is etched back anisotropically by using reactive ion etching or plasma etching, and the first gate electrode material adjacent the second side wall 1920 is further removed so as to form the first gate electrode 1610, as shown in FIG. 13. The first gate electrode 1610 has a lateral length which substantially equals a deposition thickness of the first gate conductive film 4000. Thus, a simple and effective method is provided to control the overlapping length on the source and drain regions/channel region by using the conformal deposition processing combined with the anisotropic etching back technology.

Figure 14:
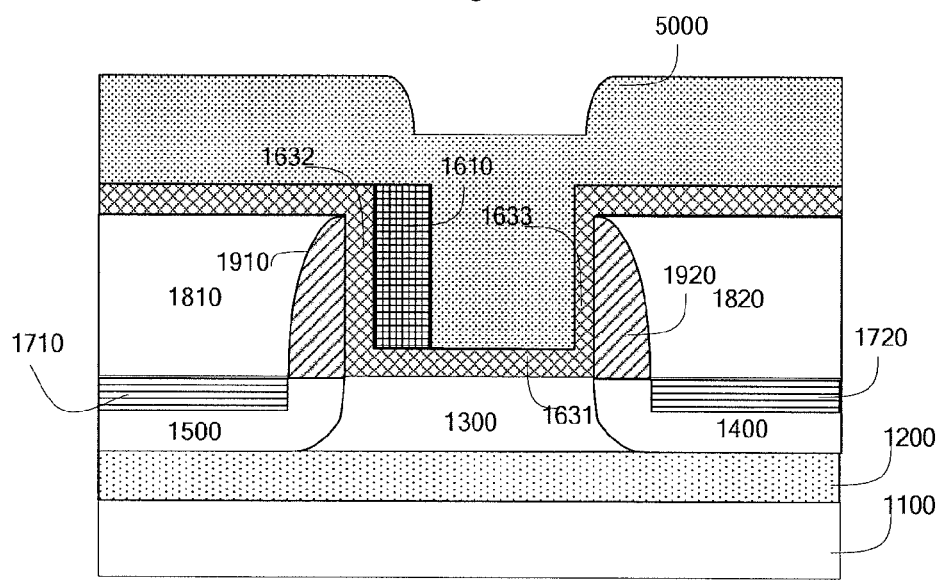

Step S111, a second gate conductive film 5000 with a second work function is deposited, as shown in FIG. 14. The second gate conductive film 5000 with a second work function may be of polycrystalline silicon, polycrystalline silicon germanium or metal.

Step S112, the chemical mechanical polishing (CMP) or plasma etching-back technique is used for planarization so as to form the second gate electrode 1620. Then, another interlayer dielectric and metal interconnect are formed by known processes, so that the TFETs fabricated on the substrate are connected to work and achieve function.

Figure 15:
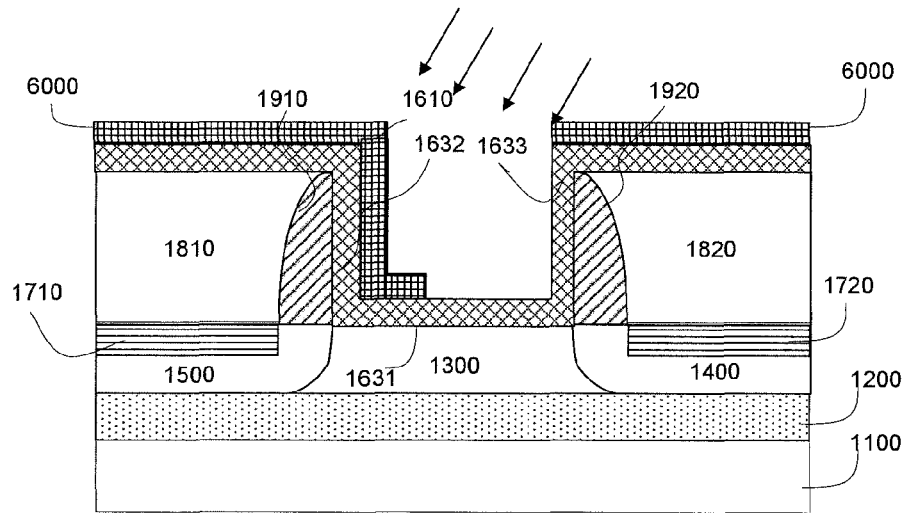
FIGS. 15-16 are cross-sectional views of a TFET showing a process of a method for forming a TFET having a hetero-material gate work function according to a second embodiment of the present disclosure.
Figure 16:
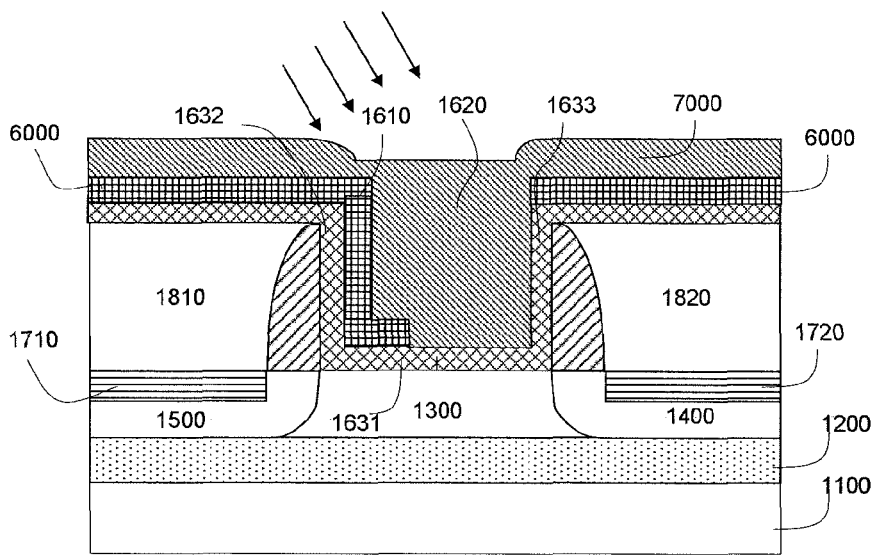

FIGS. 15-16 are cross-sectional views of a TFET showing a process of a method for forming a TFET having a hetero-material gate work function according to a second embodiment of the present disclosure. The method comprises the following steps.

Step S201, the substrate 1100 is provided.

Step S202, the sacrificial gate stack 2000 is formed on the substrate 1100.

Step S203, a first doping impurity atoms and a second doping impurity atoms are implanted into the substrate 1100 to respectively form a channel region 1300, and the source region 1500 and the drain region 1400 on the two sides of the channel region 1300. The drain region 1400 is of the first doping type and the source region 1500 is of the second doping type.

Step S204, an annealing process is carried out to activate the first doping impurity and the second doping impurity atoms.

Step S205, the first side wall 1910 and the second side wall 1920 are formed on the two sides of the sacrificial gate stack 2000, respectively.

Step S206, the interlayer dielectric layer 1810 is conformally deposited on a side of the first side wall 1910; the interlayer dielectric layer 1820 is conformally deposited on a side of the second side wall 1920. During the deposition, an interlayer dielectric layer may also be deposited on the first contact layer 1710 and the second contact layer 1720 and extended to a surface of the sacrificial gate stack 2000. And the interlayer dielectric layers are planarized by known technologies such as chemical mechanical polishing (CMP) or plasma etching.

Step S207, the sacrificial gate stack 2000 is removed to form the concave window.

Step S208, the first gate dielectric layer 1631, the second gate dielectric layer 1632 and the third gate dielectric layer 1633 are formed on the substrate in the concave window, on one side walls of the concave window and on a top surface of the interlayer dielectric layer 1810 and 1820.

Step S209, the first gate electrode material layer 6000 with the first work function is processed by vaporizing or sputtering at an angle so as to form the first gate electrode 1610 on the first gate dielectric layer 1631, as shown in FIG. 15. In the embodiment, the first gate electrode material layer 6000 is deposited at an angle $\theta_1$ so that the first gate electrode 1610 is formed only on one side wall of the concave window; at the same time, a second side wall of the concave window is sheltered by the interlayer dielectric layer. In the embodiment, the angle $\theta_1$ may be within 30 degrees to 80 degrees. It should be noted that the thickness of the interlayer dielectric layer, the width of the trench and the degrees of the angle together determine a distance the first gate electrode 1610 extending from the side wall towards a center of the concave window. In the embodiment, the first gate electrode 1610 is deposited to cover or extend to at least part of the channel region of the transistor. The length extending from the side wall to the channel region may be tuned according to an optimization of the doping concentration profile in the source region, the drain region and the channel region.

As shown in the figure, in the embodiment, the work function of the first gate electrode 1610 may be changed by introducing reactive icons. For example, the reactive ions may be provided by plasma process, ion implantation, remote plasma process and chemical process etc. In another embodiment, the reactive ions react with the first gate electrode 1610 to increase or reduce the work function of the first gate electrode 1610; when the first gate electrode 1610 is of metal, reactive ions such as but not limited to Er, Y, Pt, N, O, Cl, F and other elements may be adopted to change the work function of the first gate conductive film; when the first gate electrode 1610 is of the polycrystalline silicon or the polycrystalline silicon germanium, the n-type or p-type ions such as but not limited to B, Ph, As and other elements may be used as the reactive ions to change the work function of the first gate electrode 1610.

Step S210, a second gate electrode material layer 7000 with a second function is deposited in the concave window and extended to a surface of the first gate electrode material layer 6000 so as to form the second gate electrode 1620 on the first gate dielectric layer 1631, as shown in FIG. 16. The second work function is different from the first work function. The second gate electrode material layer 7000 is deposited to a certain thickness sufficient to fill the trench between the first gate electrode 1610 and the side wall. In the embodiment, the work function of the second gate electrode 1620 is different from that of the first gate electrode 1610. Reactive ions may be introduced in the second gate electrode 1620 to change its work function. The fabrication of second gate electrode 1620 may adopt conformal depositions such as but not limited to PECVD, ALD and CVD. As shown in the figure, the second gate electrode material layer 7000 may further be deposited upon a top surface of the first gate conductive film placed on the interlayer dielectric layer.

Step S211, the first gate electrode material layer 6000 and the second gate electrode material layer 7000 may be removed, for example, by chemical mechanical polishing, as shown in FIG. 3. As shown in the figure, the second gate electrode material layer 7000, the first gate electrode material layer 6000, the second gate dielectric layer and the third gate dielectric layer on the interlayer dielectric may be removed sequentially, so that the gate electrode of the TFET with lateral hetero-material gate work function may be formed. The second gate electrode material layer 7000 and the first gate electrode material layer 6000 on the interlayer dielectric and/or gate dielectric layer may be removed by processes such as but not limited to CMP or plasma etching back and the top surface of the gate electrode and the interlayer dielectric layer are substantially at a same level. Thus, the fabrication of the TFET with the lateral hetero-material gate work function is finished.

Another aspect of the present disclosure further provides a complementary TFET structure based on a hetero-material gate work function, comprising: n-type TFET based on the hetero-material gate work function; and p-type TFET based on the hetero-material gate work function. The n-type MET based on the hetero-material gate work function and the p-type TFET based on the hetero-material gate work function are both fabricated by the method described above.

Another aspect of the present disclosure further provides an integrated circuit chip. At least one device on the integrated circuit chip is the above semiconductor device or is the complementary TFET based on the hetero-material gate work function.

In the embodiment, the gate work function of the TFET based on the hetero-material gate work function is divided into the first work function adjacent the source region and the second work function adjacent the drain region. The first work function is smaller or larger than the second work function. In other embodiments, materials for fabricating the first gate electrode and the second gate electrode may be the same or may be different. The two work functions can be precisely adjusted by introducing reactive ions or selecting different process parameters such as type of impurity, doping concentration, germanium mole fraction. The fabrication techniques of the gate electrodes described above have a wide process window, and are easy to be implemented.

It should be noted that in other embodiments, the above steps may be referred and the difference is that the sacrificial gate dielectric layer doesn't need to be removed. Hence, the first gate electrode and the second gate electrode can be formed directly on the sacrificial gate dielectric layer.

In addition, in other embodiments, the first gate electrode and the second gate electrode may be formed by vaporizing at an angle or sputtering. The first gate electrode has an L-shape and the second gate electrode partially covers the first gate electrode, as shown in FIG. 3. In this way, unnecessary lithography or etching can be avoided by vaporizing at an angle or sputtering, so that the fabrication cost is reduced.

Figure 17:
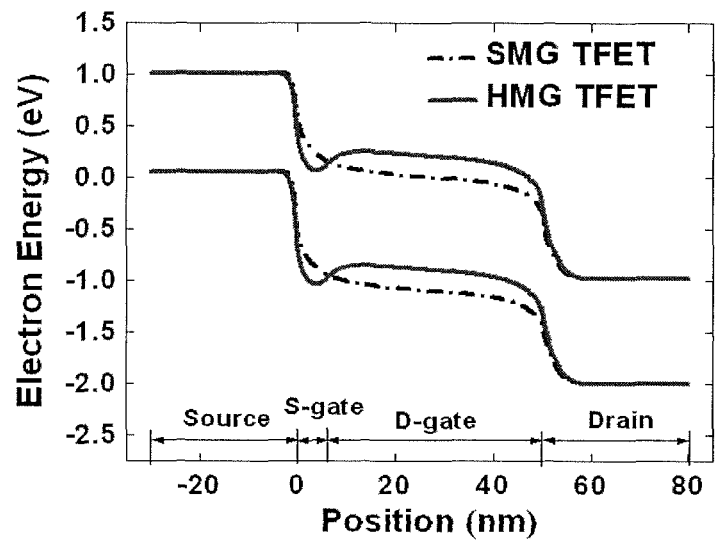
FIGS. 17-19 are schematic diagrams showing simulation results of the TFET according to embodiments of the present disclosure.
Figure 18:
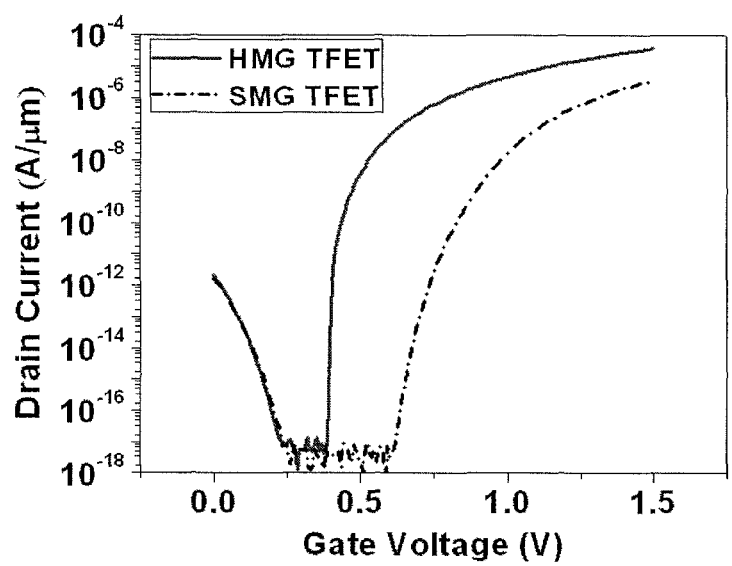
Figure 19:
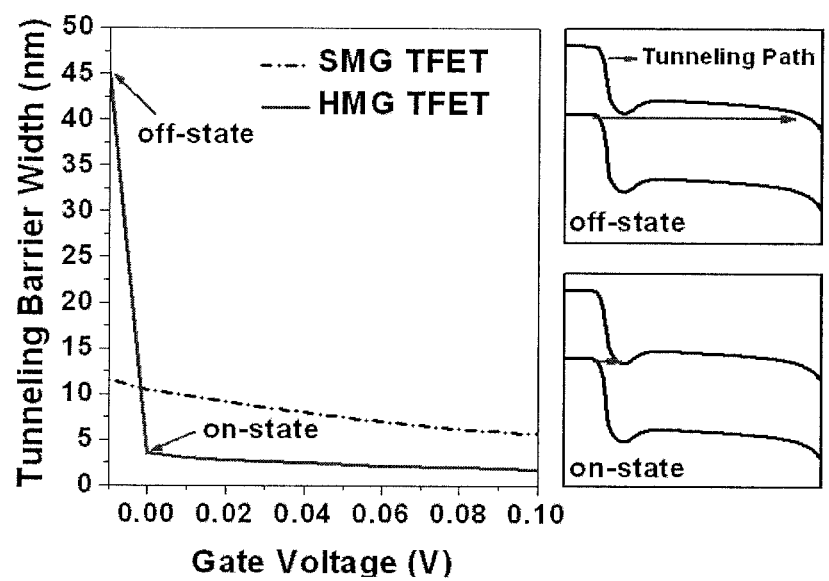

According to the present disclosure, the lateral potential profile of the TFET device is adjusted by the gate electrode material with the hetero-material work function. For N-type TFETs, the gate electrode material with a low hetero-material work function is adopted adjacent to the source region, such as Al or N-type doped polycrystalline silicon; while the gate electrode material with a high hetero-material work function is adopted adjacent to the drain region, such as Cu, Pt or P-type doped polycrystalline silicon, so as to form the hetero-material gate work function TFET (HMG TFET). FIGS. 17-19 are schematic diagrams showing simulation results of the TFET according to embodiments of the present disclosure. The HMG TFET corresponds to the embodiment of the present disclosure and the SMG TFET (single gate material TFET) corresponds to the prior art. The TFET adopts the 30 nm silicon on the insulator (SOI) as the substrate, which has a channel length of 50 nm. A gate dielectric layer is of $HfO_2$, whose equivalent oxide thickness (EOT) is 0.65 nm. The source region has boron doping at the concentration of $10^{20}$ $cm^{-3}$. The drain region has phosphorus doping at the concentration of $10^{19}$ $cm^{-3}$. The channel region has phosphorus doping at the concentration of $10^{16}$ $cm^{-3}$. During the simulation, a non-local tunneling model is adopted and the distribution of the carriers is considered. The model parameters are calibrated with the experimental data obtained from the reported literatures, which greatly improve the accuracy of the simulation.

FIG. 17 is a schematic diagram showing an energy band of the TFET with a hetero-metal-material gate work function obtained by a simulation according to an embodiment of the present disclosure. Since a special hetero-material gate structure is used, the energy band adjacent the source region is put upward and the energy band adjacent the drain region is put downward, so that a minimum value is formed. FIG. 18 is a schematic diagram showing a transfer characteristic of the TFET with a hetero-metal-material gate work function obtained by a simulation according to an embodiment of the present disclosure. Since the channel region is controlled by two gates simultaneously, the off-state changes according to the second gate (adjacent the drain region) and the on-state changes according to the first gate (adjacent the source region). As shown in FIG. 18, the HMG TFET has both properties of low off-state current and high on-state current and the sub-threshold slope decreases greatly, which can be explained by FIG. 19. As shown in FIG. 19, when the TFET is in the off-state, the tunneling path increases. With the increase of the gate voltage, once the conduction band minimum in the channel is below the valence band in a source region, the TFET device turns to be in the on-state. In this situation, the tunneling path decreases rapidly, which causes the tunneling current increases significantly, so the sub-threshold slope decreases significantly.

The embodiments of the present disclosure have the following advantages.

1. Since the TFET has the lateral hetero-material work function, the energy band profile in the channel region may be modulated, which not only significantly reduces a sub-threshold slope of the transistor significantly by using an energy band engineering technique, but also greatly increases a drive current.

2. The first gate electrode or the second gate electrode may be of various metals or alloys, doped polycrystalline silicon or doped polycrystalline silicon germanium, so that the lateral hetero-material work function may be precisely adjusted by controlling parameters such as ratio of the alloys, type and concentration of doped impurities and Ge mole fraction. The fabrication techniques of the gate electrodes described above have a wide process window, and are easy to be implemented.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A tunneling device, comprising:
   a substrate;
   a channel region formed in the substrate;
   a source region and a drain region formed on two sides of the channel region, wherein the drain region is of a first doping type and the source region is of a second doping type, and the first doping type and the second doping type are opposite; and
   a gate stack formed on the channel region and a first side wall and a second side wall formed on two sides of the gate stack, wherein the gate stack comprises:
      a first gate dielectric layer;
      at least a first gate electrode and a second gate electrode distributed in a direction from the source region to the drain region and directly formed on the first gate dielectric layer, and the first gate electrode and the second gate electrode have different work functions;
      a second gate dielectric layer formed between the first gate electrode and the first side wall; and
      a third gate dielectric layer formed between the second gate electrode and the second side wall, wherein the second gate dielectric layer and the third gate dielectric layer are connected with the first gate dielectric layer respectively,
   wherein a double dielectric spacer comprises the second gate dielectric layer, the third gate dielectric layer, the first side wall and the second side wall.

2. The tunneling device according to claim 1, wherein the channel region is of the first doping type, the second doping type or is intrinsic and the channel region connects the source region and the drain region.

3. The tunneling device according to claim 1, wherein the tunneling device is a n-type tunneling field effect transistor, the source region has a p-type resistivity, the drain region has a n-type resistivity, the first gate electrode is located adjacent to the source region and has a first work function, and the second gate electrode is located adjacent to the drain region and has a second work function, wherein the first work function is lower than the second work function by at least 0.1 eV.

4. The tunneling device according to claim 1, wherein the tunneling device is a p-type tunneling field effect transistor, the source region has a n-type resistivity, the drain region has a p-type resistivity, the first gate electrode is located adjacent to the source region and has a first work function, and the second gate electrode is located adjacent to the drain region and has a second work function, wherein the first work function is larger than the second work function by at least 0.1 eV.

5. The tunneling device according to claim 1, wherein the first gate electrode has an L-shape and the second gate electrode partially covers the first gate electrode.

6. A method for forming a tunneling device, comprising steps of:
   providing a substrate;
   forming a sacrificial gate stack on the substrate;
   implanting respectively a first doping impurity and a second doping impurity into the substrate to form a source region and a drain region, and defining an area between the source region and the drain region as a channel region,
   wherein the drain region is of a first doping type and the source region is of a second doping type and the first doping type and the second doping type are opposite;
   annealing to activate the first doping impurity and the second doping impurity;
   forming a first side wall and a second side wall on two sides of the sacrificial gate stack respectively, forming a first interlayer dielectric layer on a side of the first side wall and forming a second interlayer dielectric layer on a side of the second side wall;
   removing the sacrificial gate stack to form a concave window;
   forming a first gate dielectric layer on a bottom of the concave window;
   forming a second gate dielectric layer in the concave window and on a surface of the first side wall and extending the second gate dielectric layer on a top surface of the first interlayer dielectric layer;
   forming a third gate dielectric layer in the concave window and on a surface of the second side wall and extending the third dielectric layer on a top surface of the second interlayer dielectric layer, wherein the second gate dielectric layer and the third gate dielectric layer are connected with the first gate dielectric layer respectively;
   forming conformally a first gate electrode material layer with a first work function directly on the first gate dielectric layer, the second gate dielectric layer and the third gate dielectric layer;
   etching anisotropically the first gate electrode material layer to remove the first gate electrode material layer on the third gate dielectric layer on the top surface of the second interlayer dielectric layer, to remove the first gate electrode material layer on the second gate dielectric layer on the top surface of the first interlayer dielectric layer, and to remove the first gate electrode material layer on a part of the first gate dielectric layer to form a first gate electrode in the concave window and on a side surface of the second gate dielectric layer; and
   depositing a second gate electrode material with a second work function within a space defined by the first gate electrode, the first gate dielectric layer and the side surface of the third gate dielectric layer to form a second gate electrode, wherein the second work function is different from the first work function, wherein a double dielectric spacer comprises the second gate dielectric layer, the third gate dielectric layer, the first side wall and the second side wall.

7. The method according to claim 6, wherein the step of forming a second gate electrode comprises:

depositing a second gate electrode material within the space defined by the first gate electrode, the first gate dielectric layer and the side surface of the third gate dielectric layer and extending the second gate electrode material to a surface of the second gate dielectric layer formed on the top surface of the first interlayer dielectric layer and to a surface of the third gate dielectric layer formed on the top surface of the second interlayer dielectric layer;

removing the second gate electrode material on the surface of the first gate electrode material layer, removing the second gate electrode material layer on the second gate dielectric layer and on the third gate dielectric layer, and removing the second gate dielectric layer and the third gate dielectric layer on the first interlayer dielectric layer and on the second interlayer dielectric layer respectively; and planarizing the second gate electrode material.

8. The method according to claim 7, wherein the reactive ions are provided by ion implantation, plasma treatment or thermal annealing.

9. The method according to claim 6, further comprising a step of:

introducing reactive ions in the first gate electrode material layer to adjust the first work function.

10. The method according to claim 6, wherein the tunneling device is a n-type tunneling field effect transistor, the source region has a p-type resistivity, the drain region has a n-type resistivity, the first gate electrode is located adjacent to the source region and has a first work function, and the second gate electrode is located adjacent to the drain region and has a second work function, wherein the first work function is lower than the second work function by at least 0.1 eV.

11. The method according to claim 6, wherein the tunneling device is a p-type tunneling field effect transistor, the source region has a n-type resistivity, the drain region has a p-type resistivity, the first gate electrode is located adjacent to the source region and has a first work function, and the second gate electrode is located adjacent to the drain region and has a second work function, wherein the first work function is larger than the second work function by at least 0.1 eV.

12. The method according to claim 6, further comprising:

forming a first contact layer and a second contact layer on the source region and the drain region respectively; and forming the first interlayer dielectric layer and the second interlayer dielectric layer on the first contact layer and the second contact layer respectively.

13. A method for forming a tunneling device, comprising steps of:

providing a substrate;

forming a sacrificial gate stack on the substrate;

implanting respectively a first doping impurity and a second doping impurity into the substrate to form a source region and a drain region, and defining an area between the source region and the drain region as a channel region, wherein the drain region is of a first doping type and the source region is of a second doping type and the first doping type and the second doping type are opposite;

annealing to active the first doping impurity and the second doping impurity;

forming a first side wall and a second side wall on two sides of the sacrificial gate stack respectively, forming a first interlayer dielectric layer on a side of the first side wall and forming a second interlayer dielectric layer on a side of the second side wall;

removing the sacrificial gate stack to form a concave window;

forming a first gate dielectric layer on a bottom of the concave window;

forming a second gate dielectric layer in the concave window and on a surface of the first side wall and extending the second gate dielectric layer on a top surface of the first interlayer dielectric layer;

forming a third gate dielectric layer in the concave window and on a surface of the second side wall and extending the third dielectric layer on a top surface of the second interlayer dielectric layer, wherein the second gate dielectric layer and the third gate dielectric layer are connected with the first gate dielectric layer respectively;

vaporizing or sputtering at an angle a first gate electrode material layer with a first work function directly on a part of the first gate dielectric layer, on a top surface of the second gate dielectric layer extending on the top surface of first interlayer dielectric layer, on a top surface of the third gate dielectric layer extending on the top surface of second interlayer dielectric layer and on a side surface of the first side wall, wherein the side surface of the first side wall and the side surface of the second side wall are in the concave window;

depositing a second gate electrode material with a second work function within a space defined by the first gate electrode material layer, the first gate dielectric layer and the side surface of the third gate dielectric layer and extending the second gate electrode material to a surface of the first gate electrode material layer formed on a top surface of the first interlayer dielectric layer and on a top surface of the second interlayer dielectric layer, wherein the second work function is different from the first work function;

removing the second gate electrode material on the surface of the first gate electrode material layer, removing the first gate electrode material layer on the second gate dielectric layer and on the third gate dielectric layer, and removing the second gate dielectric layer and the third gate dielectric layer on the first interlayer dielectric layer and on the second interlayer dielectric layer respectively; and planarizing the second gate electrode material, wherein a double dielectric spacer comprises the second gate dielectric layer, the third gate dielectric layer, the first side wall and the second side wall.

14. The method according to claim 13, further comprising a step of:

introducing reactive ions in the first gate electrode material layer to adjust the first work function.

15. The method according to claim 14, wherein the reactive ions are provided by ion implantation, plasma treatment or thermal annealing.

16. The method according to claim 13, wherein the tunneling device is a n-type tunneling field effect transistor, the source region has a p-type resistivity, the drain region has a n-type resistivity, the first gate electrode is located adjacent to the source region and has a first work function, and the second gate electrode is located adjacent to the drain region and has a second work function, wherein the first work function is lower than the second work function by at least 0.1 eV.

17. The method according to claim 13, wherein the tunneling device is a p-type tunneling field effect transistor, the source region has a n-type resistivity, the drain region has a p-type resistivity, the first gate electrode is located adjacent to the source region and has a first work function, and the second gate electrode is located adjacent to the drain region and has a second work function, wherein the first work function is larger than the second work function by at least 0.1 eV.

18. The method according to claim 13, further comprising:
forming a first contact layer and a second contact layer on the source region and the drain region respectively; and
forming the first interlayer dielectric layer and the second interlayer dielectric layer on the first contact layer and the second contact layer respectively.

* * * * *